United States Patent [19]

Sandhu et al.

[11] Patent Number: 5,300,155
[45] Date of Patent: Apr. 5, 1994

[54] IC CHEMICAL MECHANICAL PLANARIZATION PROCESS INCORPORATING SLURRY TEMPERATURE CONTROL

[75] Inventors: Gurtej S. Sandhu, Boise, Id.; Chris C. Yu, Austin, Tex.

[73] Assignee: Micron Semiconductor, Inc., Boise, Id.

[21] Appl. No.: 996,985

[22] Filed: Dec. 23, 1992

[51] Int. Cl.⁵ .............................................. H01L 29/00
[52] U.S. Cl. ...................................... 148/33; 437/228; 437/248; 156/636
[58] Field of Search ................ 437/228, 946, 248; 156/636

[56] References Cited

U.S. PATENT DOCUMENTS

| | | | |
|---|---|---|---|
| 3,841,031 | 10/1974 | Walsh | 51/283 |
| 4,193,226 | 3/1980 | Gill et al. | 51/131.5 |
| 4,450,652 | 5/1984 | Walsh | 51/131.4 |
| 4,811,522 | 3/1989 | Gill | 51/131.1 |
| 4,910,155 | 3/1990 | Cote et al. | 437/8 |
| 4,956,313 | 9/1990 | Cote et al. | 437/203 |
| 4,992,135 | 2/1991 | Doan | 156/636 |
| 5,104,828 | 4/1992 | Morimoto et al. | 437/225 |

Primary Examiner—Olik Chaudhuri
Assistant Examiner—H. Jey Tsai
Attorney, Agent, or Firm—Michael W. Starkweather

[57] ABSTRACT

An IC chemical mechanical planarization (cmp) process incorporating slurry temperature control. Specifically, there is a VCMP process which requires small holders 18. The VCMP process incorporates small quantities of chemicals in the holder, and utilizes a system of closely regulating the heating and cooling of the chemical component of the VCMP process to increase and decrease the chemical reaction, and therefore the speed of the chemical removal of tungsten material.

6 Claims, 3 Drawing Sheets

IC CHEMICAL MECHANICAL PLANARIZATION PROCESS INCORPORATING SLURRY TEMPERATURE CONTROL

CROSS-REFERENCE TO RELATED OR COPENDING APPLICATIONS

U.S. Pat. No. 5,270,587 is a patent commonly assigned to the same assignee.

FIELD OF THE INVENTION

The present invention relates to integrated circuits (ICs) fabrication. Particularly, there is a vertical chemical mechanical planarization (VCMP) process incorporating slurry temperature control. Uniquely, the VCMP process speed increases when the slurry temperature increases.

BACKGROUND OF THE INVENTION

Historically, chemical mechanical planarization, also known as "CMP," has been developed for many uses in the semiconductor industry, like removing a thin top layer material from a semiconductor die.

A utilized VCMP machine, is illustrated in FIG. 1, and comprises: a wafer carrier 10 holding a semiconductor wafer 12 in a chemical slurry 14 presses against a course polishing pad 16 mounted on a platen or holder 18.

In operation, a VCMP machine works like a sanding machine and acid bath combined. To mechanically remove wafer material, wafer 12 is positionally fixed and held against pad 16 while platen or holder 18 vibrates. Slurry 14 is used to chemically remove the wafer material. Thus, it is understood why the process is called a vertical chemical mechanical planerization process.

FIG. 2 illustrates a cross-section of a wafer 12 comprising: a tungsten material 20 having a top layer 23, a few silicon-type material sections 22, and a wafer base 24.

FIG. 3 illustrates a cross-section of wafer 12 that demonstrates the goal sought when removing the top layer of material 23; leaving a desired smooth level top surface.

PROBLEMS

A major problem with current VCMP processes is that FIG. 3 is a goal that is rarely achieved, and usually at a high cost because of the low removal rates required. As illustrated in FIG. 4, tungsten material 20 has not achieved a level surface that is even with the silicon-type material sections 22. The chemical removal process continues to remove the tungsten even after the mechanical material removal process has ceased. It has been difficult to control the chemical removal process. The option of discarding the chemical process is not possible, it being the fastest removal process. Therefore, complex timing schemes have been developed for removing the wafers before the chemical process removes too much tungsten.

Another problem is that commercial models of VCMP equipment utilize large holders or polishing platen 18. This allows for multiple wafers to be polished. With this size of holders, it is very difficult if not impossible to closely regulate the temperature of the chemical removal process reactions. For this reason, temperature control has never been utilized in VCMP processes for IC wafer polishing.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the subject VCMP process. Specifically, there is a VCMP process which requires small holders 18. Additionally, the VCMP process incorporates small quantities of chemicals in the holder. Moreover, the VCMP process utilizes a system of closely regulating the heating of the chemical process to increase and decrease the chemical reaction, and therefore the speed of the chemical removal of tungsten material.

Other features and objects of the present invention will become more clear from the following detailed description of the invention, taken in conjunction with the accompanying drawings and claims, or may be learned by the practice of the invention.

Figure 1:
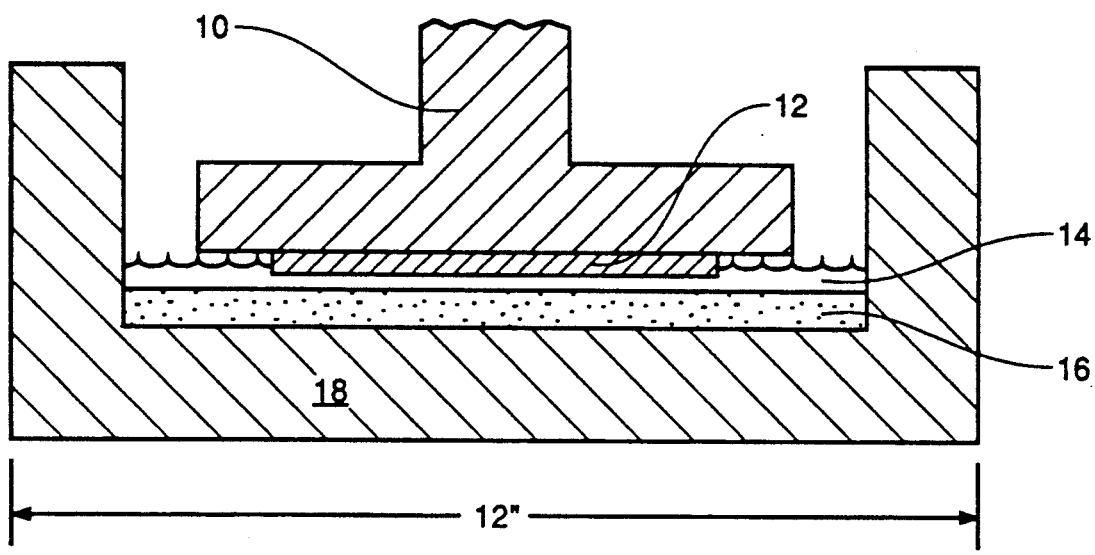
FIG. 1 is an illustration of a VCMP machine used with the invention.
Figure 2:
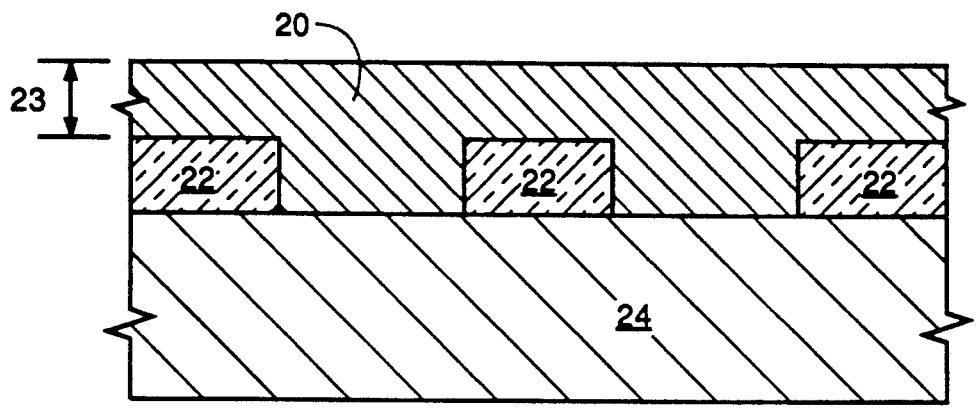
FIG. 2 is a cross-sectional view of a wafer before undergoing a VCMP process.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

Incorporated Material

The following U.S. patents are herein incorporated by reference for pertinent and supporting information:

U.S. Pat. No. 4,811,522, is a counterbalanced polishing apparatus.

U.S. Pat. No. 4,193,226, is a polishing apparatus.

U.S. Pat. No. 3,841,031, is a process for polishing thin elements.

GENERAL EMBODIMENT

Figure 5:
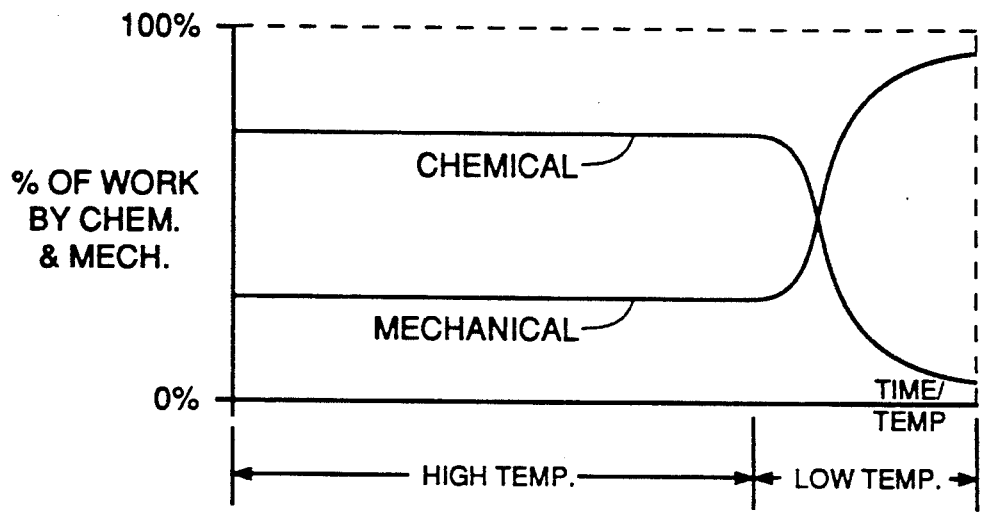
FIG. 5 illustrates the relative percentage of material removed by the chemical versus the mechanical planarization processes given the temperature change from high to low over time.
Figure 6:
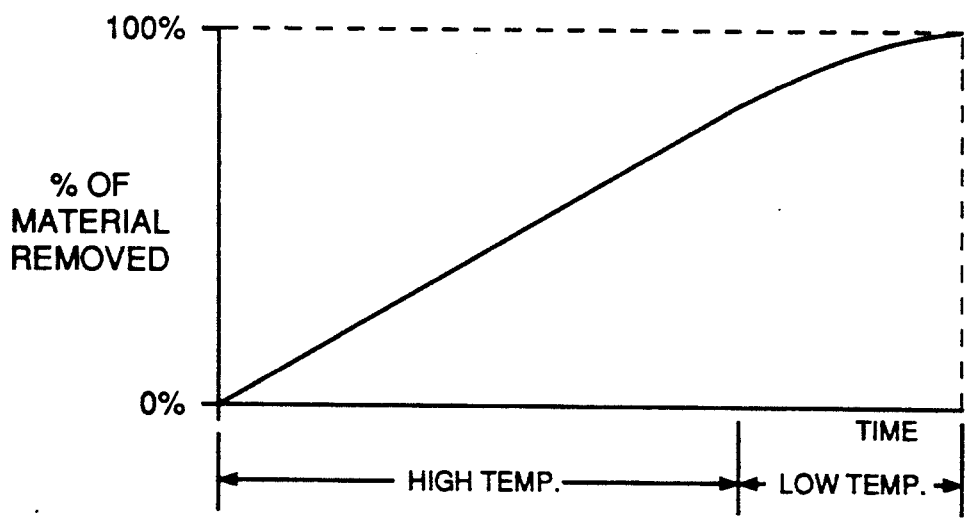
FIG. 6 illustrates the percentage of material removed over time given the high to low temperature change over time.

The following discussions are in reference to both FIG. 5 and 6. FIG. 5 illustrates the relative percentage of material removed by the chemical versus the mechanical planarization processes given the temperature change from high to low. FIG. 6 illustrates the percentage of material removed over time given the high to low temperature change. One skilled in the art will recognize that a major portion of the top tungsten layer is removed during the high temperature period of the VCMP process. Similarly, it is recognized that the relatively rapid lowering of the temperature will slow the chemical removal process, and thereby substantially eliminate the percentage of material removal by the chemical process.

Figure 3:
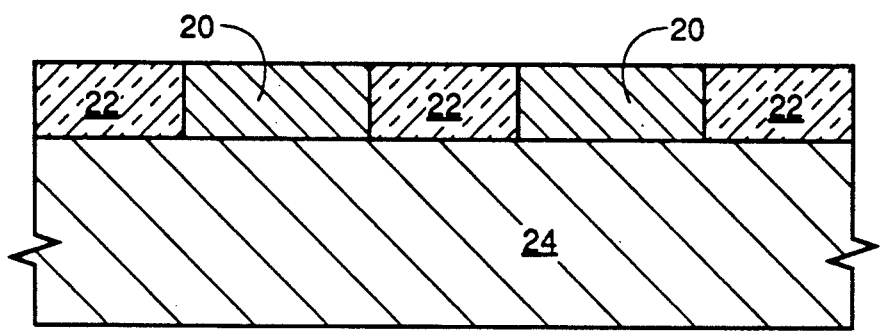
FIG. 3 is a desired cross-sectional view of a wafer after removal of the top tungsten layer.
Figure 4:
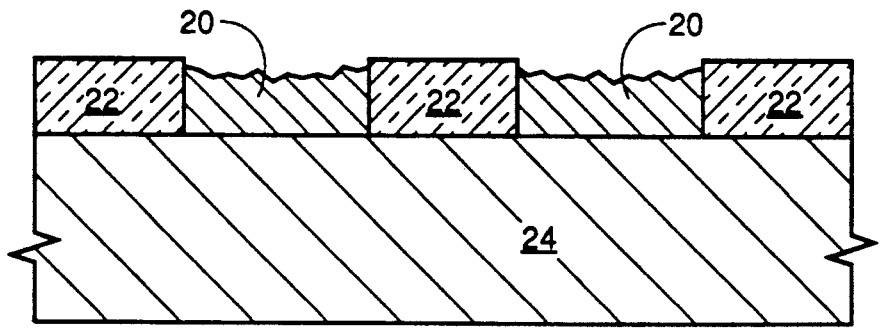
FIG. 4 is a cross-sectional view of a wafer after undergoing a typical VCMP process.

In contrast, it is understood that upon approaching the end of the process cycle, a major portion of the remainder of the material selected for removal is eliminated by mechanical action. Mechanical material removal processes are much slower than chemical; however, mechanical processes are more precise in controlling the quantity of material to be removed. Therefore, the use of the prescribed process will enable material removal to a degree exhibited in FIG. 3.

REMARKS ABOUT THE INVENTION

It is noted, by varying the temperature of the VCMP process, it will take less time to remove the desired amount of tungsten and allow for precise control of where the VCMP process will stop removing material.

VARIATIONS IN THE INVENTION

There are several obvious variations to the broad invention and thus come within the scope of the present invention. Uniquely, this invention may work with any material (metals or dielectrics) to be removed via VCMP processes; for example, Al, Cu, silicon dioxide, silicon nitride, etc. Additionally, any typical chemical base slurry used in a VCMP process will yield satisfactory results. Moreover, it is noted, the disclosed process works best when utilizing a small (relative to the wafer sizes) holder 18 and a small amount of chemical. The smaller sizes and quantities allow for tighter control of the chemical's temperature which allows for better control of precision of material removal.

While the invention has been taught with specific reference to one embodiment, someone skilled in the art will recognize that changes can be made in form and detail without departing from the spirit and the scope of the invention. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A semiconductor made by a process, comprising the following steps:
    a) providing a semiconductor wafer having:
        a substrate;
        at least two sections of a first material (22), located upon the substrate;
        a second material covering the first material and substrate;
    b) removing the second material portion that is located on top of the first material by a temperature regulated chemical mechanical planarization (cmp) process;
    c) a first time period where the CMP process removing chemical has an elevated temperature to increase the rate of the second material removal;
    d) a second time period where the CMP process removing chemical has a lowered temperature than the elevated temperature, thus decreasing the rate of the second material removal;
    e) a majority of the second material being removed by the first time period, and a smaller percentage of the second material being removed by the second time period; and
    f) a majority of the second material being removed during the first time period chemical component of the CMP process, and a smaller percentage of the second material being removed during the first time period by the mechanical component of the CMP process, 2. The semiconductor made by the process of claim 1, wherein the second material comprises tungsten.

3. The semiconductor made by the process of claim 1, wherein the second material comprises aluminum.

4. The semiconductor made by the process of claim 1, wherein the second material comprises copper.

5. The semiconductor made by the process of claim 1, wherein the second material comprises silicon-dioxide.

6. The semiconductor made by the process of claim 1, wherein the first material comprises polysilicon.

* * * * *